United States Patent [19]

Singh et al.

[11] 4,187,530

[45] Feb. 5, 1980

[54] STRUCTURE FOR SOLID STATE SWITCH

[75] Inventors: Shobha Singh, Summit; LeGrand G. Van Uitert, Morris Township, Morris County; George J. Zydzik, Columbia, all of N.J.

[73] Assignee: Bell Telephone Laboratories, Incorporated, Murray Hill, N.J.

[21] Appl. No.: 911,338

[22] Filed: Jun. 1, 1978

[51] Int. Cl.$^2$ ............................................. H01G 9/00
[52] U.S. Cl. ........................................ 361/433; 357/2
[58] Field of Search ........................... 357/2; 361/433; 350/357

[56] References Cited

U.S. PATENT DOCUMENTS

| | | | |
|---|---|---|---|
| 3,521,941 | 7/1970 | Deb et al. | 350/357 |
| 3,876,985 | 4/1975 | Fritzsche et al. | 357/2 X |
| 3,926,916 | 12/1975 | Mastrangelo | 357/2 X |

FOREIGN PATENT DOCUMENTS 2618079  10/1977  Fed. Rep. of Germany ........... 350/357

OTHER PUBLICATIONS

Faughnan et al., "Electrochromism in WO$_3$ Amorphous Films", *RCA Review*, Mar. 1975, vol. 36, pp. 177–197.
Green et al., "A Solid State Electrochromic Cell–The RbAg$_4$I$_5$/WO$_3$ System", *Thin Solid Films* 24, 1974, pp. 545–546.
Shoot et al., "New Electrochromic Memory Display", *Appl. Phys. Lett.*, vol. 23, No. 2, Jul. 15, 1973, pp. 64–65.
Y. Hajimoto et al., "Coloration in a WO$_3$ film", *Applied Physics Letters*, vol. 28, No. 4, Feb. 15, 1976, pp. 228–229.
S. K. Deb, "Optical and Photoelectric Properties and Colour Centres in Thin Films of Tungsten Oxide", *Philosophical Magazine*, vol. 27, 1973, pp. 801–822.

*Primary Examiner*—James W. Davie
*Attorney, Agent, or Firm*—Walter G. Nilsen

[57] ABSTRACT

Certain structures are described for solid state electrical switches which employ electrochromic material. These structures involve use of a common base contact for both switching and readout circuits. The structures are particularly easy to fabricate using integrated circuit techniques and exhibit reduced electrical shorts due to reduced migration of metallic ions.

13 Claims, 5 Drawing Figures

STRUCTURE FOR SOLID STATE SWITCH

TECHNICAL FIELD

The invention involves certain structures for solid state electrical switches.

BACKGROUND OF THE INVENTION

Electrical switching is extensively used for electrical apparatus and electrical circuitry for a variety of applications. For example, switches are used to turn on and off certain circuits including individual telephone lines to various customers. Inherent in such switching properties are amplifier properties and electrical energy (current) control properties. Desirable characteristics for electrically operated switches in modern electrical apparatus are high on/off resistance ratio, low insertion loss, low electrical control energy, and permanent latching on removal of control or switching energy. In addition to these desirable properties it is often advantageous in modern electrical apparatus to have extremely high reliability, large packing density and easy fabrication, particularly for large numbers of switches.

SUMMARY OF THE INVENTION

The invention is a solid state switch. This solid state switch contains electrochromic material (generally tungsten trioxide) that changes from insulator to metallic conductor on injection of certain ions under the influence of an electrical field. The structure is such that a common contact (called here the base contact) is used for both the input signal circuit and the readout circuit. Also, the readout contacts and the base contacts are in the same plane. Various geometries and fine line photolithographic techniques may be used to increase the length of interface between coplanar readout contacts and base contacts so as to reduce insertion loss. The coplanar configuration of base and readout contacts is advantageous for a number of reasons. First, these types of solid state switches may be fabricated using integrated circuit techniques. Insertion loss and resistance ratio are easily traded off by suitable changes in geometry. Also, metalion migration that may occur during the control signal pulse will be orthogonal to the readout contact. This essentially eliminates the development of shorts between the base and readout contacts.

DETAILED DESCRIPTION

Figure 1:
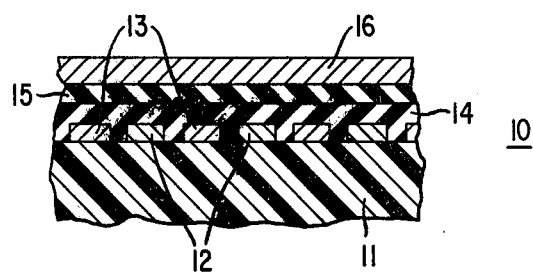
FIG. 1 shows a side view in a section of the solid state switch configuration.

The invention is a solid state switch employing a material which changes from an insulating state to a conducting state on injection of positive ions under the influence of an electric field. In particular, the invention is directed to certain structural characteristics of the solid state switch. The solid state switch is composed of input circuit or signal circuit and output circuit or readout circuit. An important characteristic of these particular switches is that the input and output circuits have a common base contact. In addition, the base contact and readout contact are located on the same plane (usually an insulating substrate) and usually parallel to one another. This provides a reasonable amount of interface between base contact and readout contact so the resistance with the switch in the "on" condition is minimized. Various interlacing configurations may be used to increase the amount of interface between base contact and readout contact. These contacts may be made of any conductive material (nickel, copper, aluminum, platinum, palladium, gold, etc., and alloys of these metals) but gold (or gold covered metal contacts) or tin oxide containing semiconducting contacts such as indium tin oxide or antimony doped tin oxide are preferred because of resistance to oxidation and excellent electrical and contact properties. The electrochromic material is located above the base and readout contacts. Any material which undergoes such an insulator to conductor transformation may be used including amorphous, polycrystalline and crystalline. Particularly convenient, are electrochromic materials such as tungsten oxide ($WO_3$) and molybdenum oxide ($MoO_3$). Many such materials have been described in the scientific literature. Exemplary articles are: U.S. Pat. No. 3,521,941, issued July 28, 1970 to S. K. Deb et al; "Electrochromism in a $WO_3$ Amorphous Films" by Brian W. Faughnan et al, *R.C.A. Review* Vol. 36, p. 177 (March 1975); "A Solid State Electrochromic Cell—The $RbAg_4I_5/WO_3$" system by M. Green and D. Richman, *Thin Solid Films* 24, S45 (1974); "Coloration in $WO_3$ Film" by Y. Hajimoto and T. Hara, *Applied Physics Letters* 28, p. 228 (February 1976); and "Optical and Photoelectric Properties of Colour Centres in Thin Films of Tungsten Oxide" by S. K. Deb, *Philosophical Magazine* 27, p. 801 (1973). The transformation from insulating to conducting state is controlled by the injection of positive ions under the influence of an electric field. The source of the positive ions is an electrolyte substance located above the electrochromic material. Various positive ions may be useful, particularly including protons and lithium positive ions as well as sodium and potassium positive ions. Source of such positive ions may be moisture in the air (for protons) as well as various insulating films or solid or liquid electrolytes. Various acids (e.g., $H_2SO_4$) as well as other substances can be used as electrolytes. For purposes of this invention, the exact nature of the electrolyte is not critical provided it supplies injection ions capable of transforming the electrochromic material from insulating state to conducting state.

A typical procedure for preparing a solid state switch is as follows: a substrate is used for convenience to mount one or more switches. The substrate is usually made of non-conducting material (glass, ceramic, etc.). Typical electrolytes may be aqueous solutions of various kinds, including acidic solutions such as aqueous nitric acid, aqueous sulfuric acid, etc. Aqueous sulfuric acid is preferred because of stability and the fact that sulfuric acid does not evaporate. Other liquid electrolytes may be used such as solutions of lithium salts (i.e., lithium bromide, lithium perchlorate, etc.) in water or various organic solvents. Also a variety of solids may be used, for example, lithium fluoride, magnesium fluoride, and lanthanum fluoride as well as other rare earth fluorides and silicon dioxide have useful properties because water from the atmosphere is absorbed by films of these compounds and serves as a source of protons. It should be realized that a large variety of other electrolyte systems which serve as a source of protons or lithium ions are also useful.

The signal control contact is located on top of the electrolyte. This contact or electrolyte may be made of any productive material as enumerated above. As in the case of other contacts in this device, gold or semiconducting tin oxide containing materials are preferred because of good electrical contact properties and chemical inertness.

A brief description of the operation of the solid state switch is useful in an understanding of the invention. A voltage applied to the input signal contact drives proton ions out of the electrolyte and into the electrochromic material. This ion injection converts the electrochromic material from insulator to conductor. This permits electrical conductivity between the readout contact and base contact. The result is that the solid state switch becomes conductive. Switching voltages (that is input circuit voltages) may vary over large limits depending on electrode spacing and the resistances desired in the "on" and "off" positions of the readout circuit. Typical switching voltages are $10^{-3}$ to 10 volts (see page 181 of the B. W. Faughnan reference) with electrochromic material thickness (or electrode spacings) of 0.1 to 100 microns (see column 4, lines 29–31 of S. K. Deb et al, U.S. Pat. No. 3,521,941). Typical conductor thicknesses vary from 100 Angstroms for transparent gold electrodes (column 8, line 2 of the Deb et al reference) to much thicker gold layers where transparency is not important.

FIG. 1 shows in cross-section a solid state switch 10 made in accordance with the invention. The solid state switch is mounted on a substrate 11. Conducting paths 12 and 13, are mounted on top of the substrate. One set of these conducting paths are the base contacts 12 and the other are the readout contacts 13. Interspaced between these conducting paths and above these conducting paths is the electrochromic material 14 generally comprising tungsten trioxide. Located above the electrochromic material is the electrolyte 15 generally comprising lithium fluoride. Above the electrolyte is the input signal contact 16 preferably comprising gold sealed down with a thin layer of lead fluoride.

Figure 2:
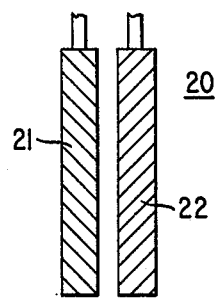
FIG. 2 shows a top view of a solid state switch in which the readout and base electrodes have minimum interface contact.

FIG. 2 shows a top view of the lower conducting paths 20 showing both the base contact 21 and the readout contact 22. The length of contact in this configuration indicates a desire to increase the amount of interface between base contact and readout contact. Spacing between base contact 21 and readout contact 22 is typically between 0.1 and 100 microns.

Figure 3:
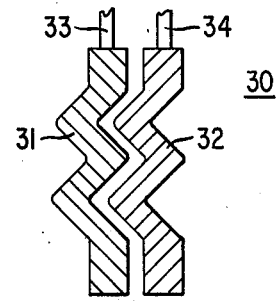
FIG. 3 shows a top view of a solid state configuration which moderately increases interface contact between readout and base electrodes.

FIG. 3 shows similar contacts as in FIG. 2 but with a configuration which further increases the amount of interface between base contact 31 and readout contact 32. It involves a zig-zag configuration with base contact running parallel to readout contact. Also shown is the connecting leads for the base contact 33 and readout contact 34.

Figure 4:
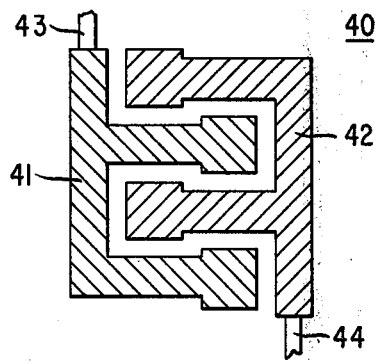
FIG. 4 shows a top view of another geometric configuration meant to increase interface contact between the readout and base contacts.

FIG. 4 shows another configuration 40 for base contact 41 and readout contact 42. This type of configuration substantially increases the amount of interface between base contact and readout contact. It involves interlacing the base contact and readout contact. Again electrical leads to the base contact 43 and readout contact 44 are shown.

Figure 5:
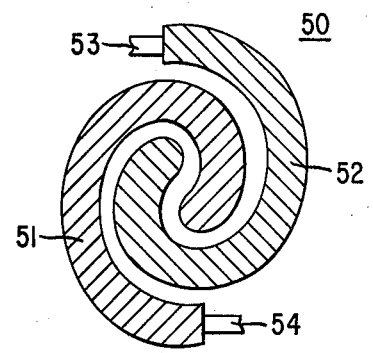
FIG. 5 shows another geometric configuration which increases interface contact between readout and base configuration.

FIG. 5 shows a spiral configuration 50 and readout contact 52. Such a configuration is highly useful where large amounts of interface and base contact is desirable. Such a situation is often desirable where insertion loss is to be minimized. The figure also shows the electrical connection to the base contact 53 and readout contact 54.

We claim:

1. A solid state electrical switch comprising an input circuit and a readout circuit in which the read out circuit is switched from insulating to conducting state under the influence of an electric field set up by the input circuit by injecting suitable positive ions into an electrochromic material and switching from conducting to insulating state by removing the positive ions from the electrochromic material by reversing the electric field CHARACTERIZED IN THAT
   (a) both the readout circuit and the input circuit have a common contact called a based contact and the readout contact and the base contact are mounted on the same plane.

2. The solid state electrical switch of claim 1 with which the readout contact and base contact are mounted on the same insulating substrate.

3. The solid state electrical switch of claim 1 in which the electrochromic material consists essentially of a substance selected from the group consisting of tungsten trioxide and molybdenum trioxide.

4. The solid state electrical switch of claim 1 in which the injection ion is selected from the group consisting of $H^+$, $Li^+$, $Na^+$, and $K^+$.

5. The solid state electrical switch of claim 1 in which the injection ion is $H^+$.

6. The solid state electrical switch of claim 1 in which the injection ion is $Li^+$.

7. The solid state electrical switch of claim 1 in which the electrolyte is an aqueous acid solution.

8. The solid state electrical switch of claim 7 in which the aqueous acid solution is sulfuric acid.

9. The solid state electrical switch of claim 1 in which the electrolyte is selected from the group consisting of silicon dioxide lithium fluoride, magnesium difluoride, lanthanum difluoride and rare earth trifluorides.

10. The solid state electrical switch of claim 1 in which the base contact and readout contact have an interlaced configuration.

11. The solid state electrical switch of claim 10 in which the base contact and readout contact have a zig-zag configuration.

12. The solid state electrical switch of claim 10 in which the base contact and readout contact have an interlacing configuration.

13. The solid state electrical switch of claim 10 in which the base contact and readout contact have a spiral configuration.

* * * * *